(12) United States Patent
Chan et al.

(10) Patent No.: US 7,148,725 B1
(45) Date of Patent: Dec. 12, 2006

(54) VOLTAGE CLAMP

(75) Inventors: Hong H. Chan, Portland, OR (US);
Jeffrey E. Smith, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 10/861,138

(22) Filed: Jun. 4, 2004

(51) Int. Cl.
*H03K 19/175* (2006.01)

(52) U.S. Cl. .............................. 326/82; 326/83; 326/26; 326/27

(58) Field of Classification Search ............ 326/22–24, 326/26–27, 82–83, 30; 327/108–112
See application file for complete search history.

(56) References Cited

U.S. PATENT DOCUMENTS

| | | | | |
|---|---|---|---|---|
| 5,182,468 A | * | 1/1993 | Erdelyi et al. ............... | 327/321 |
| 5,646,551 A | * | 7/1997 | Ting ............................. | 326/83 |
| 5,677,642 A | * | 10/1997 | Rehm et al. .................. | 327/65 |
| 5,786,720 A | * | 7/1998 | Nguyen et al. ............. | 327/321 |
| 5,973,900 A | * | 10/1999 | Sher ........................... | 361/91.5 |
| 6,002,627 A | * | 12/1999 | Chevallier .................. | 365/212 |

* cited by examiner

*Primary Examiner*—Anh Q. Tran
(74) *Attorney, Agent, or Firm*—Troutman Sanders LLP; Gerald R. Ross; James Hunt Yancey, Jr.

(57) ABSTRACT

A pre-driver 102 has a data signal input 110 to receive a data signal, a pair of voltage inputs 103,107 to receive supply voltages, and a data output 135 to provide an output voltage. A voltage clamp 130 is connected between a predetermined one of the voltage inputs 103, 107 and the data output 135 to clamp the output voltage with respect to the predetermined supply voltage. Other embodiments and methods are also described and claimed.

28 Claims, 4 Drawing Sheets

VOLTAGE CLAMP

BACKGROUND

In a high-speed digital bus, the Input/Output ("I/O") buffer edge-rate is an essential design parameter. If the buffer edge rate is not controlled within design specifications, then signal integrity issues such as inter-symbol interference ("ISI") may occur. ISI, like other signal interferences, causes degradation in system performance at higher data rates. ISI is particularly menacing because raising the signal power does not decrease the probability of making a bit error. Thus, in high speed digital transmitters, the buffer edge rate must be controlled to maintain data transfer bandwidth.

The characteristics of a pre-driver circuit used in concert with a driver circuit often determine the I/O buffer edge-rate. Usually, the I/O buffer edge-rate is a function of the pre-driver slew-rate. The slower the pre-driver slew-rate, as compared to the driver slew-rate, the more likely that ISI issues will be created when the driver switching frequency increases and the buffer edge rate remains unchanged. This often occurs when the driver bandwidth is greater than the pre-driver bandwidth. When the switching frequency is higher than the pre-driver bandwidth, the pre-driver signal swing will not be rail-to-rail. On the other hand, when the switching frequency is less than the pre-driver bandwidth, the pre-driver signal swing will be rail-to-rail. Thus, the signal swing and therefore the switching time, for the low frequency signals is greater than signal swing, and therefore the switching time, for the high frequency signals. These two different pre-driver signal swings, and their resulting switching times may result in the driver skew for an HL (High-to-Low) transition being different than the driver skew for a LH (Low-to-High) transition, which causes signal distortion and potentially frequency dependent ISI signal integrity issues. Therefore, ideally, these two skews would be approximately the same.

An ideal pre-driver circuit would operate for both low frequency and high frequency data signals in a high speed digital transmission environment without generating excessive ISI problems as well as other signal integrity issues.

DETAILED DESCRIPTION

The various embodiments of the present invention provide a voltage clamp device and method that efficiently operates in low and high frequency digital transmission systems. Generally all digital transmission systems include buffers that receive and provide electronic data from many different electronic components. These buffers assist digital transmission systems to synchronously transmit data according to digital transmission timing signals. Some embodiments of the present invention enable electronic buffers to efficiently transmit both low and high frequency data signals. Other embodiments of the present invention additionally provide a device and method for decreasing this time period while still providing a pre-driver that may activate a driver or other device. These features of some embodiments of the present invention may enable a high speed digital transmission system to transmit data with less ISI occurrences and other signal integrity issues.

Figure 1:
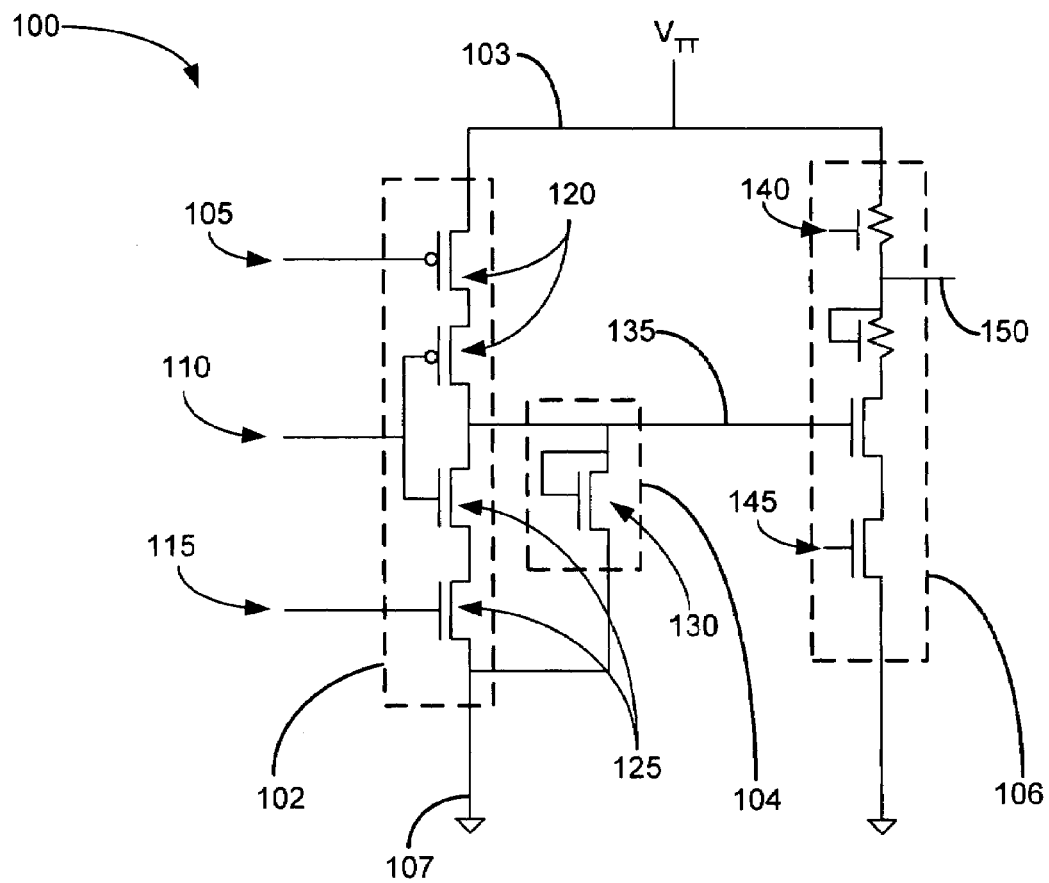
FIG. 1 illustrates an embodiment of the present invention.

Referring now to the drawings, FIG. 1 illustrates an embodiment of the present invention. In some embodiments of the present invention, a device 100 may generally comprise a pre-driver 102, a voltage clamp 104, and a driver 106. The device 100 may also generally comprise a pair of supply voltage inputs 103, 107, a data input 110, a pre-driver output 135, and a data output 150. The pre-driver 102 may receive an input data signal at data input 110 and may provide a pre-driver output signal at pre-driver output 135. The driver 106 may receive the pre-driver output signal as an input and may provide an output data signal at data output 150. The driver 106 may be any device capable of producing a desired output signal 150 in response to an input signal 135, and may comprise a plurality of bias voltage inputs 140, 145. In some embodiments, the voltage clamp 104 may clamp or lower the pre-driver output 135 to a predetermined clamping voltage, while in other embodiments, the voltage clamp 104 may be connected so as to prohibit the pre-driver output voltage from falling below a certain predetermined clamping voltage. In some embodiments, the predetermined clamping voltage may be selected so that the pre-driver output signal has a voltage level with a lower magnitude than at least one of the supply voltages 103, 107.

Device 100 depicts a device capable of efficiently controlling an I/O buffer edge rate. The pre-driver 102 may comprise a pair of series connected P-type transistors 120 and a pair of series-connected N-type transistors 125; the pairs may be connected in series. Other embodiments may comprise different transistor configurations for the pre-driver 102 and the driver 106. The pair of P-type transistors 120 may be connected to supply voltage 103, bias voltage 105, data input 110, and pre-driver output 135. The pair of N-type transistors 125 may be connected to the data input 110, bias voltage 115, pre-driver output 135, and supply voltage 107. The pre-driver 102 may comprise different electronic components or may include additional components. In some embodiments the supply voltages may be positive or negative voltages, or a supply voltage may be tied to ground, such as the exemplary connection to supply voltage 107. The voltage clamp 104 may be connected to pre-driver 102, pre-driver output 135, and to supply voltage 107. The voltage clamp 104 may be any device capable of clamping voltage or leaking current such that the magnitude of the pre-driver output voltage is lowered or controlled within certain predetermined design parameters. As shown, voltage clamp 104 may comprise an N-type transistor 130 having at least three terminals. The three terminals of the N-type transistor 130 may be connected such that a drain terminal is connected to a supply voltage such as supply voltage 107, a gate terminal may be connected to a drain terminal, and the drain terminal may be connected to the pre-driver output 135. In some embodiments, the source terminal may be connected to a supply voltage and the drain terminal may be connected to the pre-driver output. The voltage clamp 104 may also comprise other electronic components such as a resistor, and may additionally be connected differently in other embodiments. For example, the voltage clamp may be connected between the pre-driver output 135 and supply voltage 103. In some embodiments, the voltage clamp 104 may clamp or lower the pre-driver output signal 135 so that the voltage of the pre-driver output signal 135 is clamped to a desired voltage within supply voltage 103 or 107.

In some embodiments, a voltage clamp may be selected to have an impedance or resistance to yield a desired clamping voltage. For example, if $V_{TT}$ is approximately 1.32 Volts, supply voltage 107 is tied to ground, and the resistance of the pair of P-type transistors 120 equals approximately 100 Ohms, then the voltage clamp 104 may be selected to have a resistance value of approximately 1000 Ohms. This embodiment of the present invention may clamp the pre-driver output voltage 135 at a clamping voltage approximately equal to 1.2 Volts:

$$V_{CLAMP\ 135} = V_{TT} * R_{CLAMP\ 104} / (R_{CLAMP\ 104} + R_{P\ 120}).$$

In some embodiments, the pre-driver output voltage may be clamped at a voltage level lower than $V_{TT}$. This feature of some embodiments may enable the pre-driver 102 to switch output states in response to the pre-driver input signal 110 since the pre-driver output 135 signal does not have to fall from $V_{TT}$ to the driver threshold voltage, but rather only from the predetermined clamping voltage to the driver threshold voltage. This feature of the some embodiments of present invention may enable the edge rate of an electronic buffer to be reasonably consistent for both low and high data transfer rates. The pre-determined clamping voltage level may be selected so that the clamping voltage may reach at least a predetermined voltage threshold for activating or deactivating the driver 106 or another device.

In some embodiments of the present invention, the voltage clamp 104 resistance may be selected to be approximately 10 times the resistance of the pair of P-type resistors 120 so that the impedance of the pre-driver 102 is not significantly altered by the resistance of the voltage clamp 104. Other embodiments may comprise a voltage clamp with a lower or higher resistance. If the resistance of the pair of N-type transistors 125 is also approximately 100 Ohms, then the pre-driver 102 impedance may be 100 Ohms. However, utilizing an embodiment of a voltage clamp, the pre-driver 102 impedance may be 100 Ohms ($R_{N\ 125}$) when the pre-driver output is low, but may be approximately 90 Ohms ($R_{CLAMP\ 104}$ in parallel with $R_{P\ 120}$) when the pre-driver output is high. This slight asymmetry may be corrected, if desired, by decreasing the impedance of $R_{N\ 125}$ or increasing the impedance of $R_{P\ 120}$. In other embodiments of the present invention, the original impedance of the pre-driver 102 may be approximately maintained by slightly increasing the pre-driver 102 impedance. Other aspects and embodiments of the present invention are also possible when choosing the exact voltage and resistance values for the pre-driver 102 and voltage clamp 104 for producing a pre-driver output signal that may be provided to the driver 106.

Figure 2A:
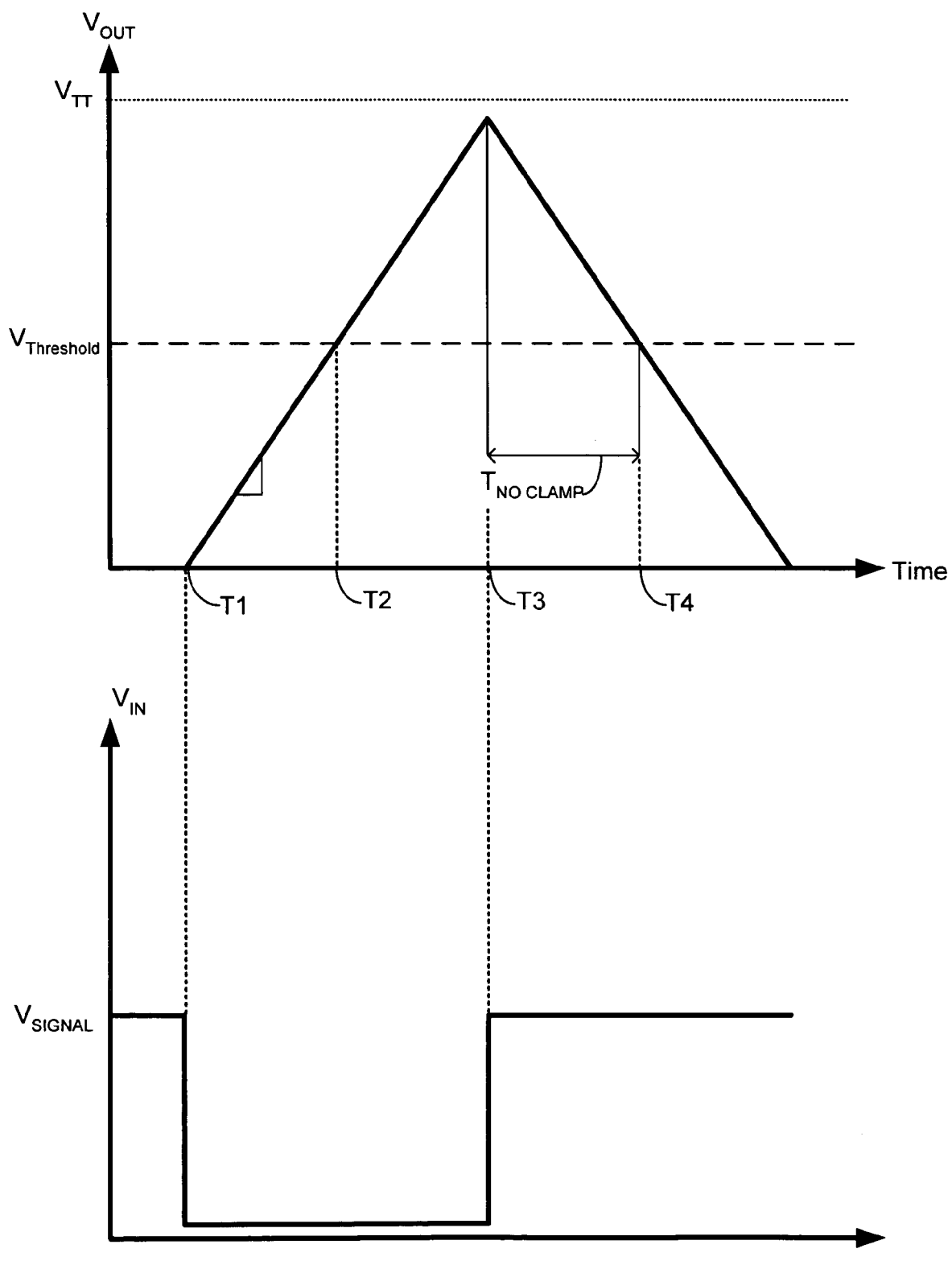
FIGS. 2A and 2B illustrate exemplary input and output wave form diagrams of a typical prior art I/O buffer not utilizing an embodiment of the present invention.
Figure 2B:
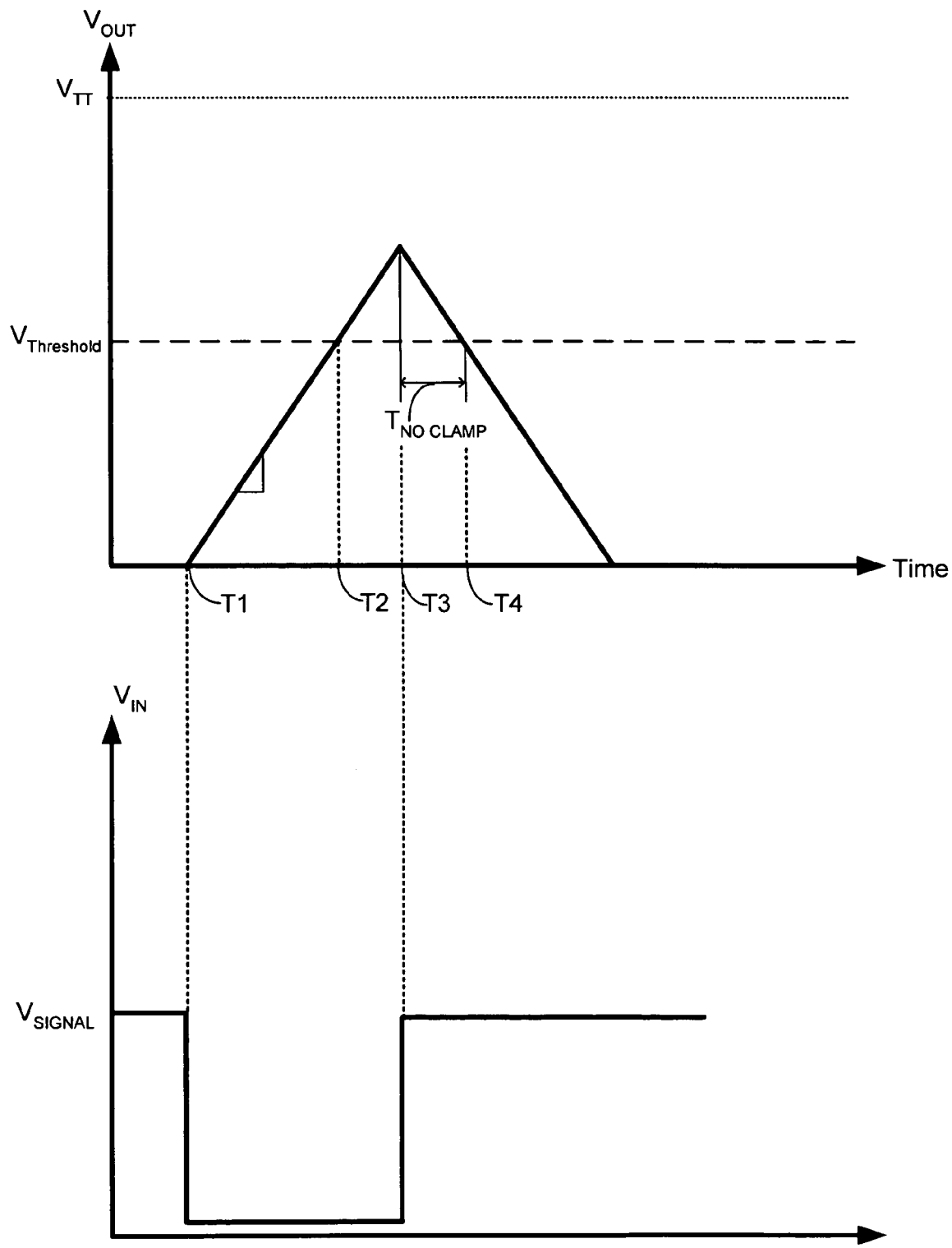

FIGS. 2A and 2B illustrate exemplary input and output wave form diagrams of a typical prior art I/O buffer not utilizing an embodiment of the present invention. FIG. 2A shows the pre-driver input ($V_{IN}$) and pre-driver output voltage ($V_{OUT}$) waveforms for a lower frequency signal. As depicted in FIG. 2A, when the pre-driver input voltage transitions from high to low (T1), the pre-driver output voltage may begin to increase at a steady slew rate until the output voltage reaches a supply voltage such as $V_{TT}$ or until the pre-driver input voltage transitions from low to high (T3). As the pre-driver output voltage may be supplied to the driver 106 or another electronic circuit, the driver 106 may have a threshold voltage ($V_{THRESHOLD}$) determining when the driver 106 may transition from low to high or high to low. As time increases in FIG. 2A, the pre-driver output voltage may rise above $V_{THRESHOLD}$ and may activate the driver 106 (T2). The driver 106 may remain activated until the output voltage falls below $V_{THRESHOLD}$.

In FIG. 2A, the pre-driver output voltage may begin to transition again when the pre-driver input signal transitions from low to high (T3). When this transition occurs, the pre-driver output voltage transitions and may decrease at a steady slew rate; this slew rate may approximately equal the rate at which the pre-driver output voltage increases. As the output voltage falls below the driver threshold voltage (T4), a driver or another electronic device may deactivate in some embodiments of the present invention. In other embodiments, falling below $V_{THRESHOLD}$ may activate some electronic devices. The amount of time between the transition of the input signal from low to high and the deactivation of the driver threshold voltage is labeled as $T_{NO\ CLAMP}$ (T4–T3). This time period represents how long the pre-driver output voltage may decrease before the driver may respond to the transition in the pre-driver input data signal.

FIG. 2B illustrates an exemplary input and output wave form diagram of a typical prior art I/O buffer having an input signal with a higher frequency than shown in FIG. 2A. FIG. 2B shows the pre-driver input ($V_{IN}$) and pre-driver output voltage ($V_{OUT}$) waveforms. As $V_{IN}$ transitions from high to low (T1), $V_{OUT}$ may eventually rise above $V_{THRESHOLD}$ (T2). $V_{OUT}$ may continue to rise until $V_{IN}$ transitions from low to high (T3), at which time, $V_{OUT}$ may begin to decrease. $V_{OUT}$ may rise and decrease at steady slew rates, and these rates may approximately equal each other in some embodiments of the present invention. If $V_{OUT}$ continues to decrease, $V_{OUT}$ may fall below $V_{THRESHOLD}$ (T4). As illustrated in FIG. 2B, $T_{NO\ CLAMP}$ represents the period of time between the low to high transition of $V_{IN}$ (T3) and the point at which $V_{OUT}$ falls below $V_{THRESHOLD}$ (T4). As can be seen by comparing FIG. 2A and FIG. 2B, the $V_{OUT}$ signal in FIG. 2B also rises above $V_{THRESHOLD}$, but not as far as the $V_{OUT}$ signal in FIG. 2A. The smaller rise of the FIG. 2B $V_{OUT}$ signal above $V_{THRESHOLD}$ yields a smaller $T_{NO\ CLAMP}$ value because the FIG. 2B $V_{OUT}$ signal falls below $V_{THRESHOLD}$ (T4) in a smaller time period as compared to the FIG. 2A $V_{OUT}$ signal. FIG. 2B also illustrates that $V_{OUT}$ still may rise above $V_{THRESHOLD}$ for higher frequency input signals and the amount of the voltage rise above $V_{THRESHOLD}$ increases the $T_{NO\ CLAMP}$ time period which may potentially increase signal distortion and ISI issues.

Figure 3:
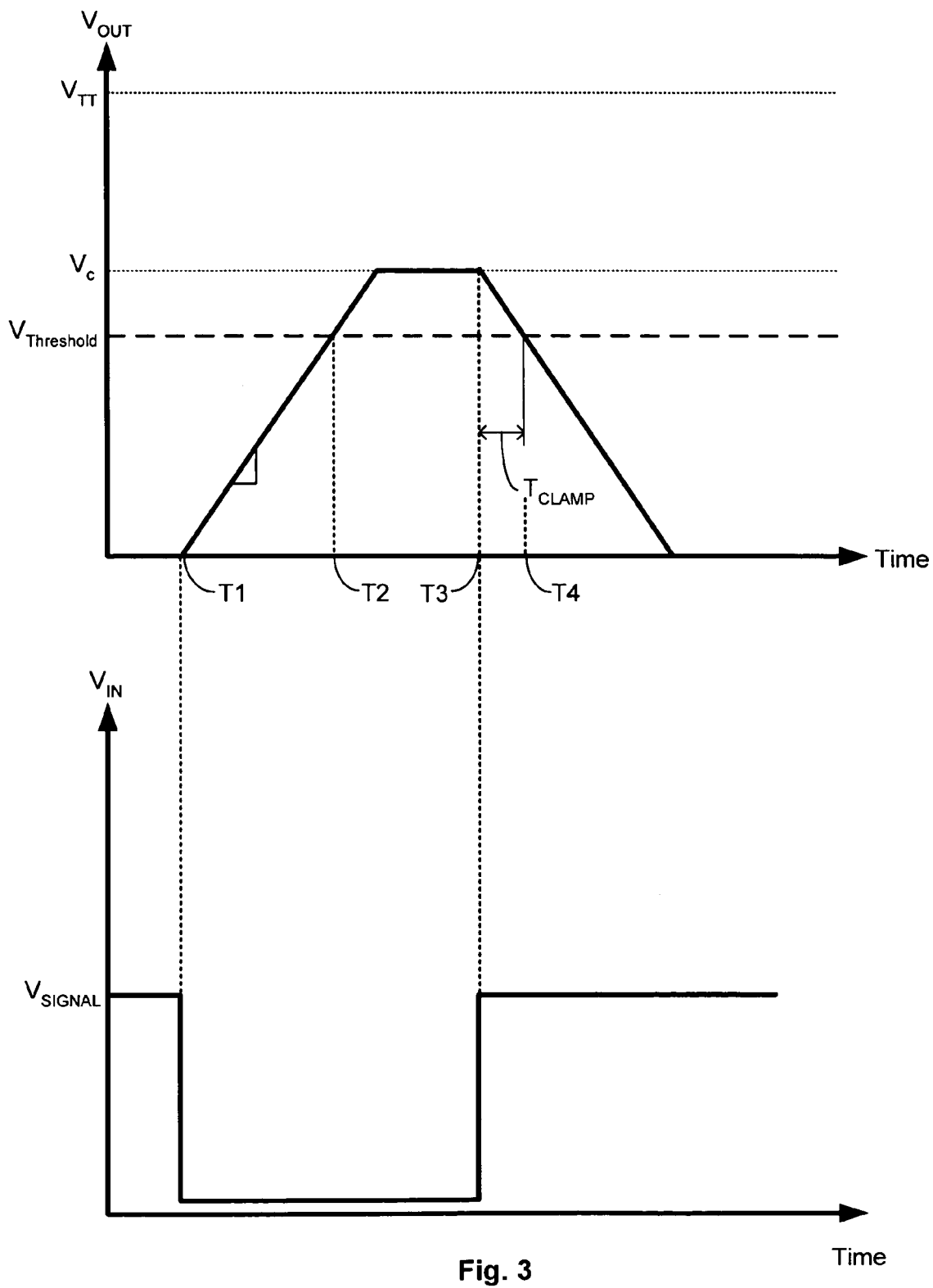
FIG. 3 illustrates an exemplary input and output wave diagram of an I/O buffer utilizing an embodiment of the present invention.

FIG. 3 illustrates an exemplary input and output wave diagram of an I/O buffer utilizing an embodiment of the present invention. FIG. 3 also shows the pre-driver input voltage ($V_{IN}$) and the pre-driver output voltage ($V_{OUT}$) waveforms. When the pre-driver input signal transitions from high to low (T1), the pre-driver output voltage may increase at a steady slew rate and may rise above a driver threshold voltage (T2). The pre-driver output voltage may continue to rise until a clamping voltage ($V_C$) level is reached. This clamping voltage level may be less than $V_{TT}$ and/or may be more than the driver threshold voltage. The pre-driver output voltage may continue to stay approximately at the clamping voltage level until the pre-driver input signal transitions (T3). As shown in FIG. 3, when the pre-driver input voltage transitions from low to high (T3), the pre-driver output voltage may decrease at a steady slew rate and may fall below the driver threshold voltage (T4). The time period from the transition of the pre-driver input signal (T3) to the pre-driver output voltage falling below the driver threshold voltage level (T4) is labeled $T_{CLAMP}$ (T4–T3). The $T_{CLAMP}$ time period may be significantly smaller than $T_{NO\ CLAMP}$, thus decreasing signal distortion, reducing ISI, and allowing the transfer of electronic data at varying rates or varying switching frequencies. Those skilled in the art will appreciate and understand that FIG. 3 is only an exemplary waveform of one embodiment of the present invention and that other waveforms may exist dependent upon the actual implementation of a voltage clamp.

The clamping voltage level may be determined by the characteristics of a voltage clamp used in a pre-driver, driver, or other device receiving the pre-driver output signal. For example, the clamping voltage may be chosen to be selected to be between one of the pre-driver supply voltages and/or the threshold or activation voltage that may be required by a driver 106 or other device. Some embodiments of the present invention provide a device and method for decreasing the pre-driver transition time while still providing a pre-driver that may activate or deactivate a driver or other device at a predetermined clamping voltage level. Although the voltage clamp utilized in the waveforms of FIG. 3 clamps the pre-driver output voltage at a positive voltage, some embodiments of the present invention may also clamp the output voltage at a negative voltage or at a zero voltage level. In other words, some embodiments of the present invention may clamp positive, negative, or both output voltages so that the magnitude of the clamped voltage is bounded to a desired value. Other system embodiments may comprise different configurations of the various embodiments of the present invention.

Figure 4:
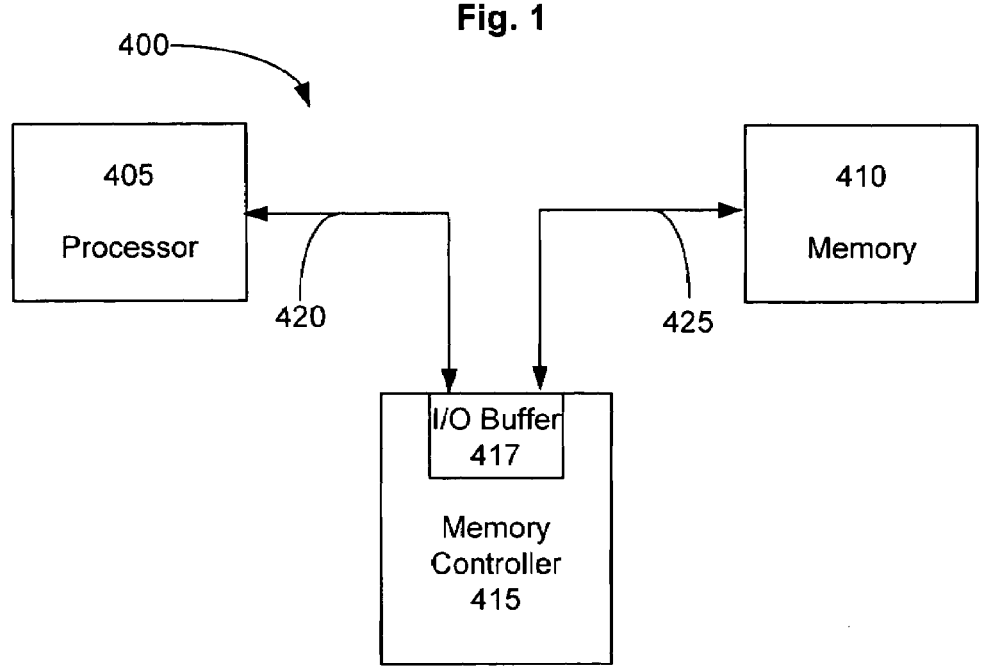
FIG. 4 illustrates an embodiment of the present invention used in a system environment.

FIG. 4 illustrates an embodiment of the present invention used in a system 400 environment. System 400 may generally comprise a processor 405, a memory 410, a memory controller 415 having an I/O buffer 417, and data buses 420, 425. Processor 405 may be connected to the memory controller 415 with data bus 420 and the memory 410 may be connected to the memory controller 415 with data bus 425. Data buses 420, 425 may be any medium capable of allowing electronic data flow, and data buses 420, 425 may be either serial or parallel data buses. The I/O buffer 417 may comprise a pre-driver, a driver, and a voltage clamp, such as shown in FIG. 1, for example. The pre-driver may comprise a data input to receive an input signal, a pair of voltage inputs to receive supply voltages, and a data output to provide an output signal. The voltage clamp may be connected between a predetermined one of the voltage inputs and the data output, to clamp the magnitude of the pre-driver output signal with respect to the predetermined supply voltage.

Some embodiments of the present invention may also be alternatively utilized in other system components having an I/O buffer, or capable of transmitting or receiving electronic data. For example, some embodiments of the present invention may be an internal or external component of the processor 405 or the memory 410. Additionally, some systems utilizing various embodiments of the present invention may utilize a plurality of voltage clamp embodiments to improve data transfer bandwidth.

System 400 includes a memory controller 415 and two data buses 420, 425, and may contain various embodiments of the present invention. Data bus 420 may be a front side bus enabling data to flow between the processor 405 and the memory controller 415. The memory controller 415 may comprise one or a plurality of voltage clamp embodiments for an I/O buffer. The memory controller 415 may also utilize some of the other embodiments of the present invention in transmitting high speed data between the processor 405 and the memory controller 415, or other data devices. A data device may comprise, for example, a memory, an I/O buffer, a stand alone memory system, an I/O device having an internal memory system, or other type of device which may accept and/or send data. The memory controller 415 may also utilize other embodiments of the present invention when transmitting data between the memory 410, an I/O device containing memory, or another electronic component capable of receiving electronic data. For example, in some embodiments the memory controller 415 may comprise and I/O buffer that may transmit data between memory 410 and memory controller 415 via data bus 425. Data bus 425 may be known as a backside bus, and the memory controller 415 may be additionally be configured with a plurality of I/O buffer having various embodiments of the present invention to transmit data between various components utilizing a plurality of data buses.

Although the present invention has been described with reference to the above discussed embodiments, the present invention should not be construed to cover only these embodiments. Rather, these embodiments are only exemplary embodiments. Additionally, variations of the above exemplary embodiments may suggest themselves to those skilled in the art or others without departing from the spirit and scope of the present invention. The appended claims and their full range of equivalents should, therefore, only define the full scope of the present invention.

We claim:

1. A device comprising:
a pre-driver comprising a signal input to receive a data signal having varying data rates, a pair of voltage inputs to receive supply voltages, and a data output to provide an output voltage; and
a voltage clamp, connected between a predetermined one of the voltage inputs and the voltage output, to clamp the output voltage with respect to the predetermined supply voltage at a predetermined clamping voltage so that the data output transitions from the clamping voltage and not the predetermined supply voltage in response to the data signal having varying data rates to reduce the transition response of the pre-driver, wherein the voltage clamp has a predetermined resistance that does not substantially alter an impedance associated with the pre-driver.

2. The device of claim 1, wherein the pre-driver circuit further comprises a pair of series connected P-type transistors, wherein one of the P-type transistors has an input connected to the data input and an output connected to the data output.

3. The device of claim 1, wherein the pre-driver circuit further comprises a pair of series connected N-type transistors, wherein one of the N-type transistors has an input connected to the data input and an output connected to the data output.

4. The device of claim 1, wherein the voltage clamp is a transistor comprising at least three terminals, wherein a first terminal is connected to the predetermined supply voltage, a second terminal is connected to a third terminal, and the third terminal is connected to the data output.

5. The device of claim 3 wherein, the pair of series-connected N-type transistors has a predetermined resistance and the voltage clamp has a clamping resistance, wherein the clamping resistance is greater than the predetermined resistance.

6. The device of claim 5 wherein the clamping resistance is approximately 10 times the predetermined resistance.

7. The device of claim 2 wherein, the pair of series-connected P-type transistors has a predetermined resistance and the voltage clamp has a clamping resistance, wherein the clamping resistance is greater than the predetermined resistance.

8. The device of claim 7 wherein the clamping resistance is approximately 10 times the predetermined resistance.

9. The device of claim 4 wherein the transistor has a drain as the third terminal, a gate as the second terminal, and a source as the first terminal, wherein the first terminal is coupled to the second terminal.

10. The device of claim 1 wherein the voltage clamp comprises a resistor.

11. A device comprising:
   a pre-driver to provide a pre-driver output voltage, the pre-driver comprising a pre-driver output, a first voltage input to receive a first voltage, a second voltage input to receive a second voltage, and a data input to receive an input signal having a varying data rate;
   a voltage clamp, connected between the pre-driver output and a selected one of the first and second voltage inputs, to clamp the pre-driver output voltage at a clamping voltage such that the pre-driver output voltage is less than the selected one of the first and second voltages, and wherein the pre-driver output voltage transitions from the clamping voltage and not the selected one of the first and second voltages in response to the varying date rate of the input signal; and
   a driver having an input connected to the pre-driver output to provide an output data signal responsive to the pre-driver output voltage, wherein the voltage clamp has a predetermined resistance that does not substantially alter an impedance associated with the pre-driver.

12. The device of claim 11 wherein the driver has a threshold voltage, and the magnitude of the threshold voltage is less than the magnitude of the clamping voltage.

13. The device of claim 11 wherein the voltage clamp comprises a transistor having a drain, a gate, and a source, wherein the gate is connected to the drain, the drain is connected to the pre-driver output, and the source is connected to the selected one of the first and second voltage inputs.

14. The device of claim 11 wherein the voltage clamp comprises a resistor.

15. The device of claim 11 wherein the voltage clamp has a clamping impedance and the pre-driver further comprises a pair of N-type transistors having a predetermined impedance less than the clamping impedance, wherein one of the N-type transistors has a terminal connected to the data input and a terminal connected to the pre-driver output.

16. The device of claim 15 wherein the clamping impedance is selected to provide a predetermined clamping voltage such that the magnitude of the pre-driver output voltage does not exceed the magnitude of the clamping voltage.

17. The device of claim 11 wherein the voltage clamp has a clamping impedance and the pre-driver further comprises a pair of connected P-type transistors having a predetermined impedance less than the clamping impedance, wherein one of the P-type transistors has a terminal connected to the data input and a terminal connected to the pre-driver output.

18. The device of claim 17 wherein the clamping impedance is selected to provide a predetermined clamping voltage such that the magnitude of the pre-driver output voltage does not exceed the magnitude of the clamping voltage.

19. A system comprising:
   a memory controller, comprising a pre-driver, a driver, and a voltage clamp;
   the pre-driver comprising a data input to receive an input signal having a varying data rate, a pair of voltage inputs to receive supply voltages, and a data output to provide an output signal; and
   the voltage clamp, connected between a predetermined one of the voltage inputs and the data output, to clamp the magnitude of the output signal with respect to the predetermined supply voltage at a clamping voltage such that output signal transitions from the clamping voltage and not the predetermined supply voltage to reduce the transition response of the pre-driver,
   wherein the output signal exceeds a predetermined threshold voltage to activate the driver, the output signal having a substantially consistent edge rate in response to the varying data rate of the input signal and the reduced transition response of the pre-driver, and wherein the voltage clamp has a predetermined resistance that does not substantially alter an impedance associated with the pre-driver; and
   a data device coupled to the memory controller with a parallel data bus.

20. The system of claim 19 wherein the data device is a memory.

21. The system of claim 19 wherein the data device is a processor.

22. The system of claim 19 wherein the pre-driver further comprises a pair of connected N-type transistors having a predetermined resistance less than the resistance of the voltage clamp, wherein one of the N-type transistors has a port connected to the data input and a port connected to data output.

23. The system of claim 19 wherein the pre-driver further comprises a pair of connected P-type transistors having a predetermined resistance less than the resistance of the voltage clamp, wherein one of the P-type transistors has a port connected to the data input and a port connected to data output.

24. The system of claim 19 wherein the voltage clamp comprises a transistor having a drain, a gate, and a source, wherein the gate is connected to the drain.

25. A method comprising:
   receiving a supply voltage;
   receiving an input signal having a varying data rate; and
   providing an output signal responsive to the varying data rate of the input signal, the output signal having an output voltage clamped at a predetermined clamping voltage, wherein the magnitude of the predetermined clamping voltage is less than the magnitude of the supply voltage; and
   wherein the output signal transitions from the clamping voltage and not the supply voltage in response to the data signal having varying data rates to reduce the transition response of the output signal responsive to varying data rate of the input signal; and wherein the voltage clamp has a predetermined resistance that does not substantially alter an impedance associated with the pre-driver.

26. The method of claim 25 wherein the input signal is received by a pre-driver having a first resistance, the method further comprising selecting a second resistance for the voltage clamp, wherein the second resistance is greater than the first resistance.

27. The method of claim 25 wherein further comprising providing the output signal to a driver.

28. The method of claim 25 wherein the output voltage is clamped by a voltage clamp comprising a transistor having a drain, a gate, and a source, wherein the gate is connected to the drain.

* * * * *